US005654714A

United States Patent [19]
Takahashi et al.

[11] Patent Number: 5,654,714
[45] Date of Patent: Aug. 5, 1997

[54] REMOTE CONTROLLER AND METHOD FOR PRESETTING CONTROL DATA THEREIN

[75] Inventors: Toshiyuki Takahashi; Hajime Yano, both of Kanagawa; Iwao Takiguchi, Chiba, all of Japan

[73] Assignee: Sony Corporation, Tokyo, Japan

[21] Appl. No.: 570,264

[22] Filed: Dec. 11, 1995

Related U.S. Application Data

[62] Division of Ser. No. 208,384, Mar. 10, 1994.

[30] Foreign Application Priority Data

Mar. 19, 1993 [JP] Japan ................................. 5-083910
Oct. 7, 1993 [JP] Japan ................................. 5-274826

[51] Int. Cl.$^6$ ................................. G08C 19/12
[52] U.S. Cl. .............. 341/176; 340/825.57; 359/148
[58] Field of Search ................................. 341/176, 177, 341/178, 179, 181, 182; 359/146, 148; 340/825.57, 825.69, 825.72

[56] References Cited

U.S. PATENT DOCUMENTS 4,999,622  3/1991  Amano et al. ................... 341/176
5,485,149  1/1996  Takiguchi et al. .................. 359/148

FOREIGN PATENT DOCUMENTS 0380371  8/1990  European Pat. Off. .

Primary Examiner—Jeffery Hofsass
Assistant Examiner—Andrew Hill
Attorney, Agent, or Firm—Jay H. Maioli

[57] ABSTRACT

A remote controller that has preset therein control signals of various formats/code systems in correspondence with different kinds of electronic equipment and of different manufacturers detects the control signal from another remote controller typically used with the electronic equipment, compares it with the preset data, selects a predetermined signal from the preset data and stores it in a memory for use in controlling the electronic equipment. Identifier codes may also be stored in the memory to save memory capacity. With only one input operation, all control signals in the same category, such as channel codes for a television, may be learned and stored in the memory in correspondence with the respective keys. Provision is made to determine whether the input control signal is in the form of a toggle code, thereby executing the learn function for control signals that include the toggle code.

13 Claims, 15 Drawing Sheets

| NUMBER KEY | CONTROL SIGNAL |
|---|---|
| 1 | A Corp. |
| 2 | B Corp. Code $C_{B1}$ |
| 3 | C Corp. |
| 4 | D Corp. |
| 5 | E Corp. |
| 6 | F Corp. |
| 7 | G Corp. |
| 8 | H Corp. |
| 9 | I Corp. |
| 10 | B Corp. Code $C_{B2}$ |

FIG. 3

| NUMBER KEY | | CONTROL SIGNAL |
|---|---|---|
| 1 | 1 | A Corp. Code $C_{A1}$ |
| 1 | 2 | A Corp. Code $C_{A2}$ |
| 1 | 3 | A Corp. Code $C_{A3}$ |
| 2 | 1 | B Corp. Code $C_{B1}$ |
| 2 | 2 | B Corp. Code $C_{B2}$ |
| 2 | 3 | B Corp. Code $C_{B3}$ |
| 3 | 1 | C Corp. Code $C_{C1}$ |
| 3 | 2 | C Corp. Code $C_{C2}$ |
| 4 | 1 | D Corp. |
| 5 | 1 | E Corp. |
| 6 | 1 | F Corp. |
| 7 | 1 | G Corp. |
| 8 | 1 | H Corp. |
| 9 | 1 | I Corp. |
| 10 | 1 | J Corp. Code $C_{J1}$ |
| 10 | 2 | J Corp. Code $C_{J2}$ |
| 11 | 1 | K Corp. Code $C_{K1}$ |
| 11 | 2 | K Corp. Code $C_{K2}$ |
| 12 | 1 | L Corp. |

FIG. 13

| FORMAT | CODE SYSTEM | CATEGORY | FUNCTIONS | | | | | |
|---|---|---|---|---|---|---|---|---|
| | | | 1ch | 2ch | 3ch | ----- | 12ch | |
| A | ① | 07 | 20 | 21 | 22 | ----- | 2B | |
| | ② | 05 | 10 | 11 | 12 | ----- | 1B | |
| | ③ | 0F | 31 | 32 | 33 | ----- | 3C | |
| | ④ | 11 | 20 | 21 | 22 | ----- | 2B | |
| B | ④ | 11 | 20 | 21 | 22 | ----- | 2B | 1 |
| C | ② | 05 | 10 | 11 | 12 | ----- | 1B | 0 |
| | ⑤ | 0A | 01 | 02 | 03 | ----- | 0C | 0 |
| | ⑥ | 0F | 01 | 02 | 03 | ----- | 0C | 1 |

FIG. 16

|  |  | TOGGLE BIT | CATEGORY | FUNCTION |
|---|---|---|---|---|
| $ch_1$ | HEADER | 0 | 0 7 | 2 0 |
|  | HEADER | 1 | 0 7 | 2 0 |
| $ch_2$ | HEADER | 0 | 0 7 | 2 1 |
|  | HEADER | 1 | 0 7 | 2 1 |

REMOTE CONTROLLER AND METHOD FOR PRESETTING CONTROL DATA THEREIN

This is a division of application Ser. No. 08/208,384 filed Mar. 10, 1994.

BACKGROUND OF THE INVENTION

1. Field of the Invention

The present invention relates generally to a remote controller for remotely operating electronic equipment and, more specifically, to a remote controller that can learn commands for operating such equipment.

2. Description of the Prior Art

Remote controllers that use infrared and electromagnetic waves to transmit modulated control data to remotely control electronic equipment such as, for example, television sets, stereo sets, and Video Tape Recorders (VTRs) are well known. For example, shown in FIG. 1 is an infrared remote controller that has a light transmitter 1 consisting of an infrared ray transmitting element and an infrared transmission filter at its front end, and a number of operating keys or buttons 2 on its upper surface. Each of the operating keys 2 can cause an electronic appliance or equipment to perform some operation. For example, in a television receiver a button PW could turn the electric supply on and off, and keys numbered "1" to "12" could represent television channels.

Reference character 2M shown in FIG. 1 designates a mode key for selecting a set-up operation of the control signal which has been preset in a manner to be described below. By switching the mode key 2M from the operational mode, in which the control signal is output in correspondence with the operation of one of the buttons 2, to the select set-up mode the desired control signal is selected from the control signals as preset data for performing the select set-up operation corresponding to the operating key 2.

A command signal is typically obtained by modulating a fixed frequency carrier and is then transmitted as an infrared ray. Many different command formats are available depending on the carrier frequency, the pulse bit periods, and frame structures. Thus, the coding systems are different depending on the format adopted. There are many cases where these formats vary with the maker, model, or year in which the electronic equipment was manufactured. Because the remote controller has to be exclusively prepared in accordance with each various electronic appliance, the user has to set up the remote controller so that it can be used with the particular desired electronic appliance.

In response to this situation, remote controllers have been developed that store in advance, or are preset, and can output groups of control signals having different signal structures, such as formats and code systems, for various manufacturers and different models of electronic equipment. These controllers are referred to hereinafter as preset remote controllers.

Also well-known are so-called "learn" type remote controllers, in which control signals are not preset and the control signals are stored by the user using another remote controller intended specifically for the electronic equipment being controlled. In the case of the learn type remote controllers, however, the user has to cause the remote controllers to learn the control signals one-by-one corresponding to each operating key and, hence, the set-up operation prior to use is lengthy and complicated disadvantageously. In general, preset type remote controllers or other remote controllers to which the learn function has been added are widely used.

With the preset remote controllers, as shown in a table of FIG. 2, the control signal groups for the electronic equipment corresponding to each of the various manufacturers, for example, "A" corporation through "I" corporation, are preset in, for example, a read only memory or ROM. When a manufacturer such as "B" corporation has two kinds of control signal groups having different formats and/or code systems, for example, code CB1 and code CB2, these are then preset separately.

Each control signal group is then allotted to a numbered key and the user can call up the desired control signal group by the select set-up operation. For example, if key number "1" and the PW key are pressed together, the control signal group with the format and code system adopted by "A" corporation will be selected, and when the several other operation keys 2 of the remote controller are pressed the control signals for "A" corporation's equipment will be produced.

With the preset remote controller described above, each type of control signal group is preset into the unit. This means that when setting up equipment modes using a select set-up operation that employs the numbered keys, the number of control signal groups that can be preset is limited to the number of operating keys 2, that is, the quantity of numbered keys present. Also, if there are a very large number of different kinds of control signal groups and if just twelve presets are assigned to certain control signal groups, then there will still be groups that cannot be preset, and the remote controller will therefore not be able to operate the electronic equipment corresponding to these leftover groups.

On the other hand, when presetting using numbered keys for a large number of types of control signal groups, it is possible to store the control signal groups by using two or more numbered keys corresponding to each control signal group, as shown in FIG. 3.

In this case, if the user holds down the PW key and then presses key "1" and key "2", the control signal group CA2 having the code system and format for "A" corporation will be selected. By doing this it will be possible to store almost any number of types of control signal formats and codes, although this will of course depend upon the amount of memory space available in the ROM.

Nevertheless, this does present a problem in that the select setting operation becomes very complicated. Also, the user may know the name of the manufacturer of the electronic equipment being used but it is unlikely that the user will have an understanding that goes as far as knowing the control signal format or the control system. Thus, the user will not know which of the three codes CB1 to CB3 should be selected, and so will have to repeat the complicated select setting procedure until the correct control signal for operating that product has been output. Therefore, if a variety of kinds of control signal groups are preset, the operating property of the remote controller will be deteriorated.

Furthermore, there is a case where the user might not know the name of the manufacturer of the electronic equipment being used by him or her. In this case, it is almost impossible to perform the select set-up operation and it is impossible to use the preset remote controller.

There are also other remote controllers that are popular, particularly in European countries, in which the control signals are in the form of "toggle" codes. In such toggle codes a toggle bit is provided in a portion of the control signal and the toggle bit is outputted in a reversed manner for every alternate operation. For example, the toggle bit outputted by the first operation is "0", the toggle bit outputted by the next operation is "1", and the toggle bit outputted by the next subsequent operation is "0" again, and so on. Thus, the toggle bit of the control signal is changed back and forth between the odd and even numbers of operation times.

There are some advantages in this system. For example, the user may press key "1" twice, but the electric equipment does not discriminate between selection of channel "11" from the selection of channel "1" twice. The electric equipment measures an interval between the first key operation and the second key operation and the interval is compared with a predetermined time. If the interval time is less than the predetermined time, the central processing unit discriminates selection of channel "11". on the other hand, if interval time is greater than the predetermined time, the electric equipment discriminates selection of channel "1" and the judgement is quickly reached by using the toggle codes.

If the user pressed the key "1" continuously, and if an obstacle crossed between the electric equipment and the remote controller, then the remote control signal is interrupted. Nevertheless, the electric equipment does not discriminate between the operation of the same key twice or the interruption of the remote signal. Because the control signal includes information relating to the number of operation times, then the equipment is able to discriminate between the operation of the same key twice or the interruption of the remote signal.

Such system suffers from a problem in that it is impossible to effect the so-called "learn" mode with the control signal in the form of the toggle codes. Namely, in the case where the control signal in the form of a certain toggle code is learned, what is learned and stored is only the code inputted through the learning operation when the toggle bit is either "0" or "1". For example, assuming that the toggle bit of the control signal during the learn input is "1", when the learned control signal is outputted, the toggle bit is always kept at "1". Accordingly, it is impossible to receive a correct control signal in the electronic equipment of the kind that responds to the toggle code system.

OBJECTS AND SUMMARY OF THE INVENTION

Accordingly, in view of the above-noted defects, an object of the invention is to provide a remote controller in which a group of control signals of a plurality of kinds of signal structures, such as formats or code systems, are preset and which is responsible to all kinds of electronic equipment to thereby enhance the operational property of the select set-up of the preset control signal group and it is a further object to provide such a remote controller that can learn the control signal in the form of a toggle code.

According to an aspect of the present invention, there is provided a remote controller having a plurality of buttons or keys for operational input to transmit predetermined control signals to electronic equipment in response to operation of the buttons to thereby execute respective operations of the electronic equipment, having a detector for detecting a control signal output from another remote controller, a first memory, such as a random access memory, for storing preset data, which are various control signals having a plurality of signal structures associated with various kinds and makes of electronic equipment, a second memory, such as a read only memory, for storing the control signals associated with the plurality of operating buttons, an analyzer for analyzing the control signal input from the detector and for judging a signal structure and a control content of the last-mentioned control signal, and a central processing unit for reading out a predetermined control signal from the first memory on the basis of analysis results through the analyzer and for storing the read-out signal into the second storage means in correspondence with the predetermined operating button, to thereby selectively set up the preset data in response to the control signal input thereto.

If any of the operating buttons is operated when an operational mode is selected, the control signal stored in correspondence with the operated buttons from the second memory is read out and transmitted to the electronic equipment.

According to another aspect of the invention, there is provided a remote controller having a plurality of operating buttons for operational input to transmit predetermined control signals to electronic equipment in response to the operational input by the operating buttons to thereby execute respective operations of the electronic equipment, having a detector for receiving a control signal from another remote controller a first memory, such as a random access memory, for storing preset data, which are various control signals of a plurality of signal structures associated with various electronic equipment, a second memory, such as a read only memory, for storing data associated with the plurality of operating buttons, an analyzer for analyzing the control signal received by the detector and the control signals stored in the first memory for judging a signal structure and a control content of the control signals in the form of identifier codes, and a preset register controller for storing in the second memory, in the form of the identifier codes, the control signal read out from the detector or the control signal read out from the first memory on the basis of analysis results through the analyzer in correspondence with the predetermined operating buttons, to thereby selectively set up the preset data in response to the received control signal.

If any of the operating buttons is operated when an operational mode is selected, the identifier codes stored in correspondence with the operated buttons from the second memory is read out, and the control signal corresponding to the read-out identifier codes are read out from the first memory and are transmitted.

According to still another aspect of the invention, there is provided a remote controller having a plurality of operating buttons for operational input to transmit predetermined control signals to electronic equipment in response to the operational input by the operating buttons, to thereby execute respective operations of the electronic equipment, including a detector for inputting a control signal output from another remote controller, a first memory, such as a random access memory, storing preset data made up of various control signals of a plurality of signal structures associated with various electronic equipments, a second memory, such as a read only memory, for storing the control signals and/or identifier codes representative of the control signals associated with the plurality of operating buttons, an analyzer for analyzing the control signal received by the detector and for judging a signal structure and a control content of the control signals, and a preset register controller for reading out the respective control signals stored in the first memory as the control signal that belongs to the input control signal, and for storing, in the second memory, the read-out control signal or the identifier codes representative of the control signal read out from the first memory, on the basis of the results from the analyzer in correspondence with the predetermined operating buttons, to thereby selectively set up the preset data in response to the input control signal.

If any of the operating buttons is operated when an operational mode is selected, in response to the control signal or the identifier codes stored in correspondence with the operated buttons from the second memory, a specific control signal is output and transmitted to the electronic equipment.

According to still another aspect of the invention, there is provided a remote controller having a plurality of operating buttons for operational input to transmit predetermined control signals to electronic equipment in response to the operation of the operating buttons, to thereby execute respective operations of the electronic equipment, a detector for detecting a control signal output from another remote controller, a first memory, such as a random access memory, for storing information for identifying that a plurality of signal structures associated with various corresponding units of electronic equipment are in the form of a toggle code in which a portion of the signal structure is changed in response to successive operational button actuations, a second memory, such as a read only memory, for storing the control signal associated with each of the operating buttons, an analyzer for analyzing the control signal input to the detector and for determining whether a signal structure and a control content of the control signal are in the form of the toggle code and, if the inputted control signal is determined to be in the form of the toggle code by the analyzer, a controller for determining the control signal to be the toggle code whose portion is changed in response to the number of the operational times and storing the control signal in the second memory in correspondence with a predetermined one of the operating buttons.

If one of the operating buttons corresponding to the control signal stored in the second memory as the toggle code is operated in an operational mode, the control signal is output and transmitted while the portion of the control signal is changed in response to the number of times the buttons are operated.

According to still another aspect of the invention, there is provided a remote controller having a plurality of operating buttons for operational input to transmit predetermined control signals to electronic equipment in response to operating the buttons, to thereby execute respective operations of the electronic equipment, including a detector for receiving a control signal output from another remote control, a first memory, such as a random access memory, for storing information for identifying that a plurality of signal structures associated with various electronic equipment are in the form of toggle codes in which a portion of the signal structure is changed in response to the number of times the button is operated, a second memory for storing control signals in correspondence with associated ones of the operating buttons, an analyzer for analyzing the control signal inputted from the detector twice or more times and for determining whether a signal structure and a control content of the control signal are in the form of the toggle code, and if the inputted control signal is determined to be in the form of the toggle code by the analyzer, a controller for determining the control signal to be the toggle code a portion of which is changed in response to the number of times the button was operated and storing the control signal in the second memory in correspondence with a predetermined one of the operating buttons.

If one of the operating buttons corresponding to the control signal stored in the second memory as the toggle code is operated in an operational mode, the control signal is output and transmitted while the portion of the control signal is changed in response to the number of the times the button was operated.

BRIEF DESCRIPTION OF THE DRAWINGS

FIG. 3 is another chart showing a preset state of the control signal group for a conventional remote controller;

FIG. 13 is a chart showing a preset state of the control signal in the remote controller according to the invention;

FIG. 16 is a chart of control signal codes for a toggle code; and

DETAILED DESCRIPTION OF PREFERRED EMBODIMENTS

Embodiments of the present invention will now be described. The common structure for the remote controller in respective embodiments of the invention will first be described with reference to FIGS. 4 through 6 and the specific operations will be described later. The external appearance of the remote controller can be the same as that in FIG. 1.

Figures 1, 2:
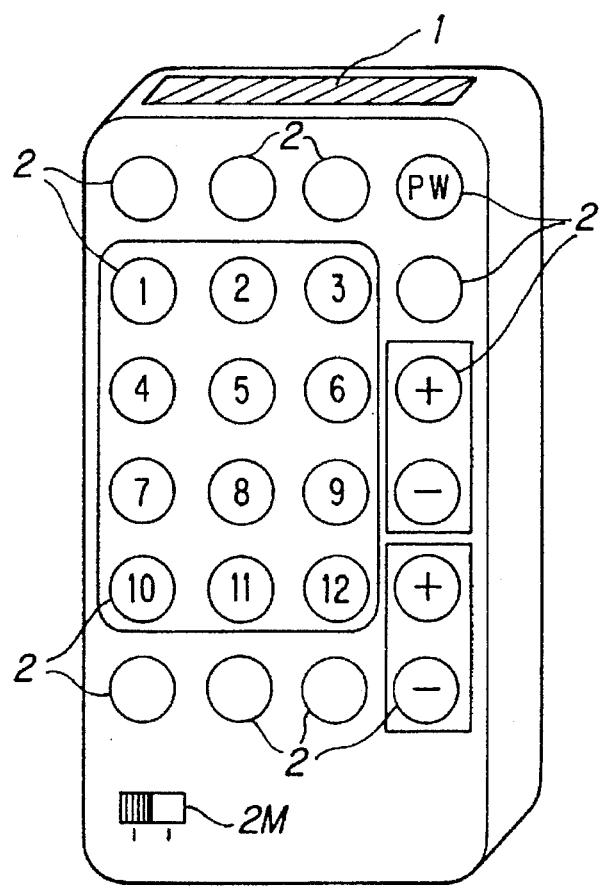
FIG. 1 is a perspective view showing a remote controller.
FIG. 2 is a chart showing a preset state of the control signal group for a conventional remote controller.
Figure 4:
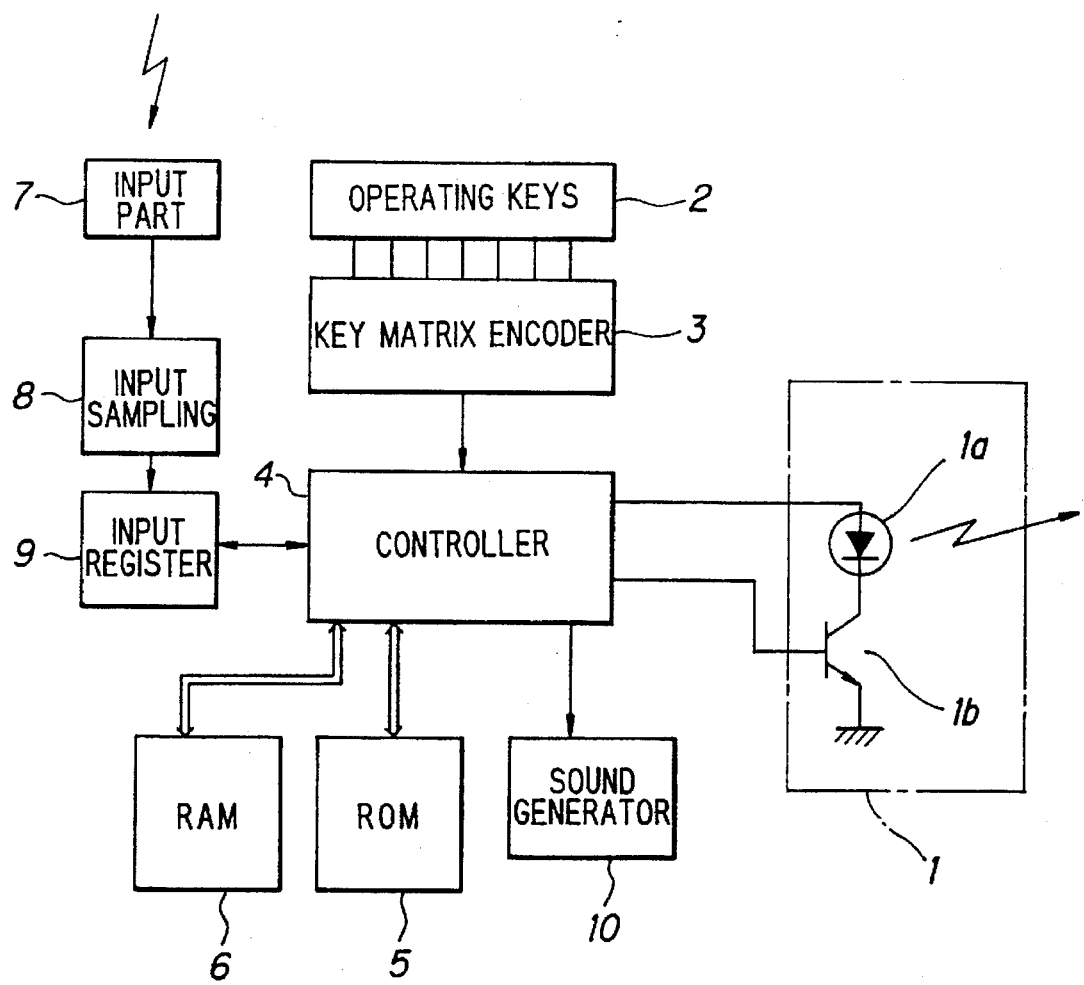
FIG. 4 is a block diagram showing a remote controller according to an embodiment of the invention.

FIG. 4 is a block diagram of the remote controller according to an embodiment of the invention in which reference numeral 2 indicates operating keys or buttons as shown in FIG. 1, which operating keys cause a predetermined control signal to be transmitted upon pressing the keys 2.

A key matrix encoder 3 outputs the information input by the user via the operating keys 2 to a microcomputer-based control unit 4 that selects and outputs the desired control signal according to the operating input information provided by the key matrix encoder 3.

A Read Only Memory 5 (ROM) stores various control signals as preset data. A Random Access Memory 6 (RAM)

holds data selectively preset corresponding to each operating key 2, that is, selected control signals and/or identifier codes indicating the control signals.

More specifically, in the case of this remote controller, a plurality of control signal groups corresponding to the different makers and/or the various units of electronic equipment are stored in the ROM 5 as the preset data. The control signal groups consist of the various signal structures, that is, the formats and code systems.

Upon the user performing the select set-up operation, the respective control signals are selected in correspondence with the respective operating keys 2 from the preset data and the selected information is held in the RAM 6. Thereafter, in correspondence with the operation of the operating keys 2, the data of the RAM 6 are read out or referred to, thereby outputting and transmitting the associated control signals.

The transmission output of the control signals is carried out using a light emitter 1, such as an infrared ray light emitting diode (LED) 1a that has a light emitting driver part 1b. The control unit 4 performs the ON/OFF control for switching the transistor of the light emitter drive 1b corresponding to the control signal to be output. The signal control is obtained by modulating the control information with a predetermined carrier.

An input part 7 made of photo diodes receives the infrared control signal. In the case where the remote controller is in the select set-up mode, when an infrared control signal is received by the input part 7 from another remote controller, the infrared ray signal is converted into an electric signal and is fed to an input sampling part 8 where the input signal is sampled with a predetermined sampling frequency and coded into data. The data that have been sampled and coded are held in an input register 9 and are introduced into the control unit 4 at a predetermined timing. A sound generator 10 is controlled by the control unit 4 and produces electronic sounds to signal the user concerning successful operation.

Figure 5:
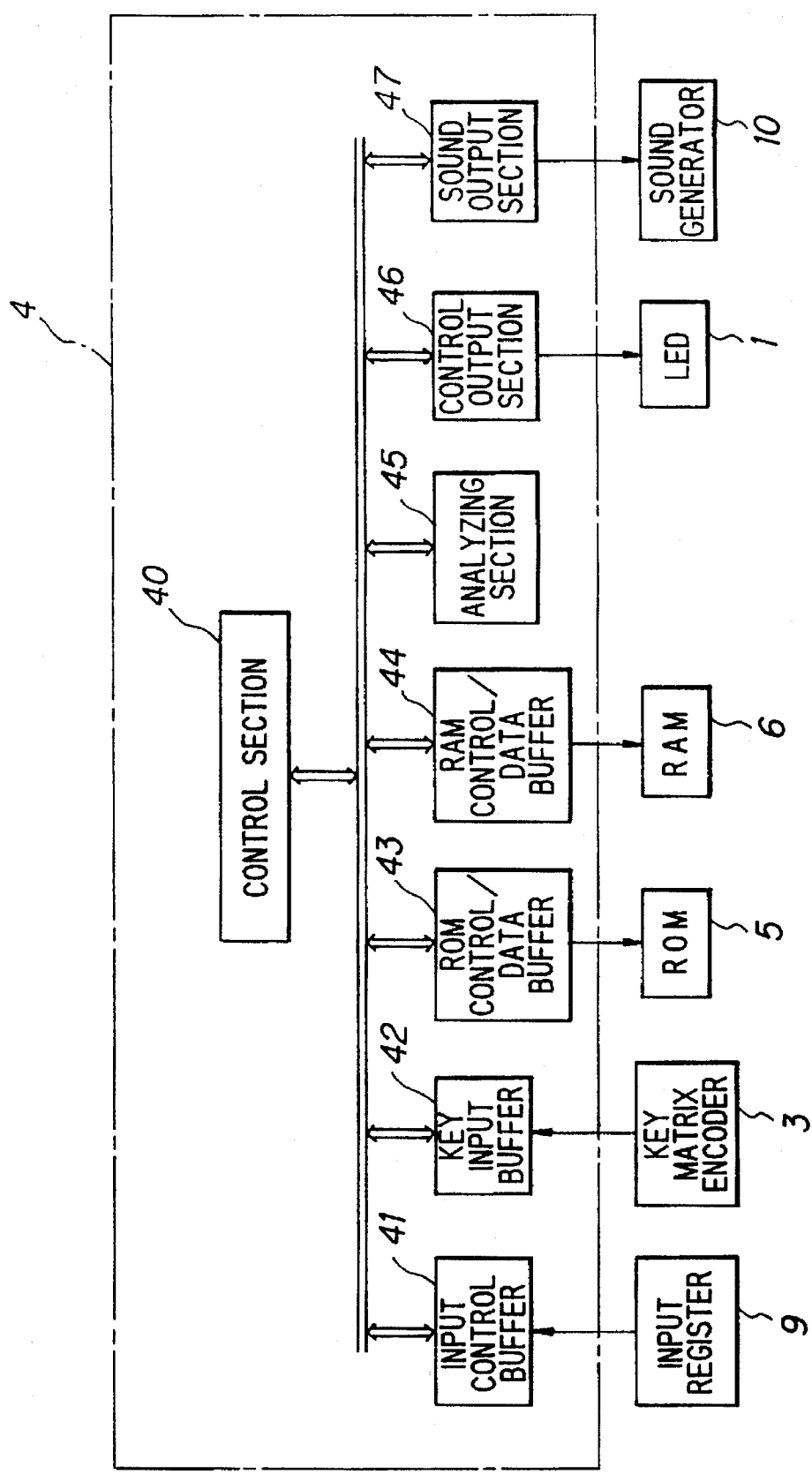
FIG. 5 is a block diagram of a controller for the remote controller shown in FIG. 4.

FIG. 5 shows an internal structure of the control unit 4 of FIG. 4 and when the control unit 4 is a microcomputer the block diagram shown in FIG. 5 is actually composed of software, in which case the control unit 4 may function as a Central Processing Unit (CPU), registers, interfaces and the like in a hardware aspect.

A control section 40 performs a variety of arithmetic calculations or computation controls and an input control buffer 41 holds the control signal introduced from the input register 9. A key input buffer 42 holds the control signal introduced from the key matrix encoder 3. A ROM control/data buffer section 43 controls the readout to the ROM 5 and buffers the data read out. A RAM control/data buffer section 44 controls the read/write to the ROM 6 and buffers the data to be read out and to be written. An analyzer 45 analyzes the control signal introduced into the input control buffer 41 or the control signal read out from the ROM 5 or from the RAM 6 and judges the structure of the control signal and the content thereof.

A control output part or output interface 46 modulates the predetermined control signal in response to the operational information introduced into the key input part 42 and outputs the signal to the light emitting section 1. A sound output section 47 drives the sound generator 10 in accordance with a command from the control section 40.

Figure 6:
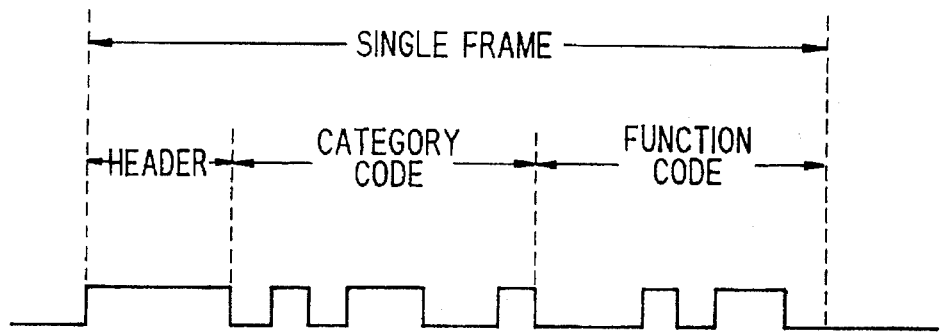
FIG. 6 is a waveform of a control signal.

FIG. 6 shows a general form of the control signal, in which a single frame of the control signal is separated into a header, a category code, and a function code. In some formats, there is no header. The category code relates to the manufacturer of the electronic equipment or the model of the equipment. The function code indicates the function to be performed, such as a power source turn-on and turn-off, increasing the volume, setting a channel to "1", and the like.

There are various formats and carrier frequencies or pulse widths depending upon the respective makers and models. For instance, the carrier frequency can be 40 KHz, 36.667 KHz, 37.917 KHz, or 32.768 KHz. Also, for the category code and the function codes, there are various different code systems that are adopted corresponding to the makers and the models.

In the remote controller according to this embodiment, in order to correspond to the various units of electronic equipment that have code systems that are different from each other, the control signal groups for various formats and code systems are preset into the ROM 5. Then, one of the control signal groups is output from the light emitter 1 via an infrared ray signal corresponding to each operating key 2 selected and set up by the user. As a result, it is possible for the user to remotely control the equipment in actual use.

Accordingly, the user has to perform the select set-up operation for allotting the control signal groups of the predetermined formats or code systems to the respective operating keys in correspondence with the units of electronic equipment that are possessed by him or her for using the remote controller according to the present invention. Nevertheless, in accordance with the present embodiment the select set-up operation is very easy.

The select set-up operation and the output operation of the control signals based upon the select set-up operation in accordance with the first embodiment will be explained with reference to the flowcharts shown in FIGS. 7 to 9.

Incidentally, for the sake of simplifying the explanation, assume that a control signal for switching channels of a television set is referred to, the formats A, B, and C are present for carriers, pulse widths and the like, and code systems 1 to 6 are present for category codes and function codes. Furthermore, assume that in order to correspond to any of these factors, the control signals representative of the respective formats and code systems are preset into the ROM 5 as shown in FIG. 13. In this embodiment, the category codes and the function codes which show the content of the actual control can be represented by hexadecimal values.

Figure 7:
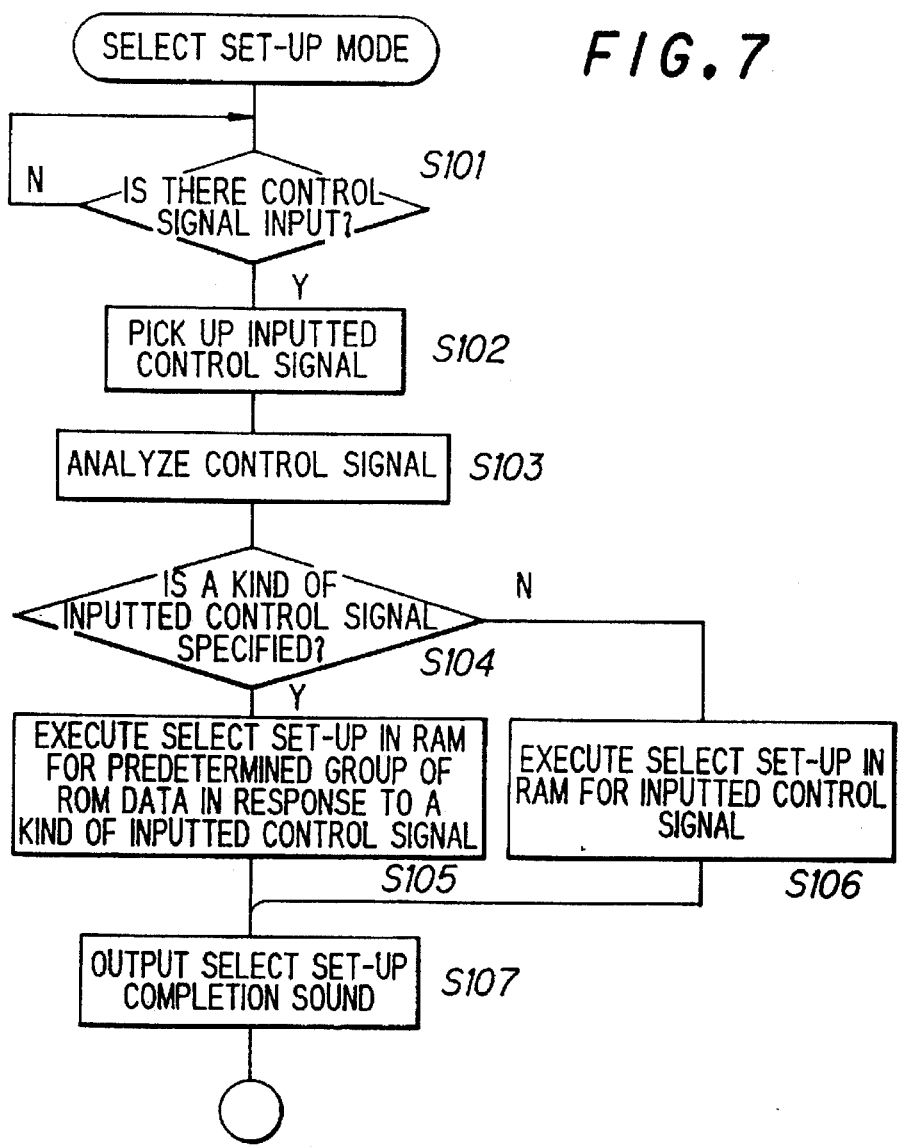
FIG. 7 is a flow chart of a process in a selective set-up mode of the control signal for the remote controller according to a first embodiment of the invention.
Figure 8:
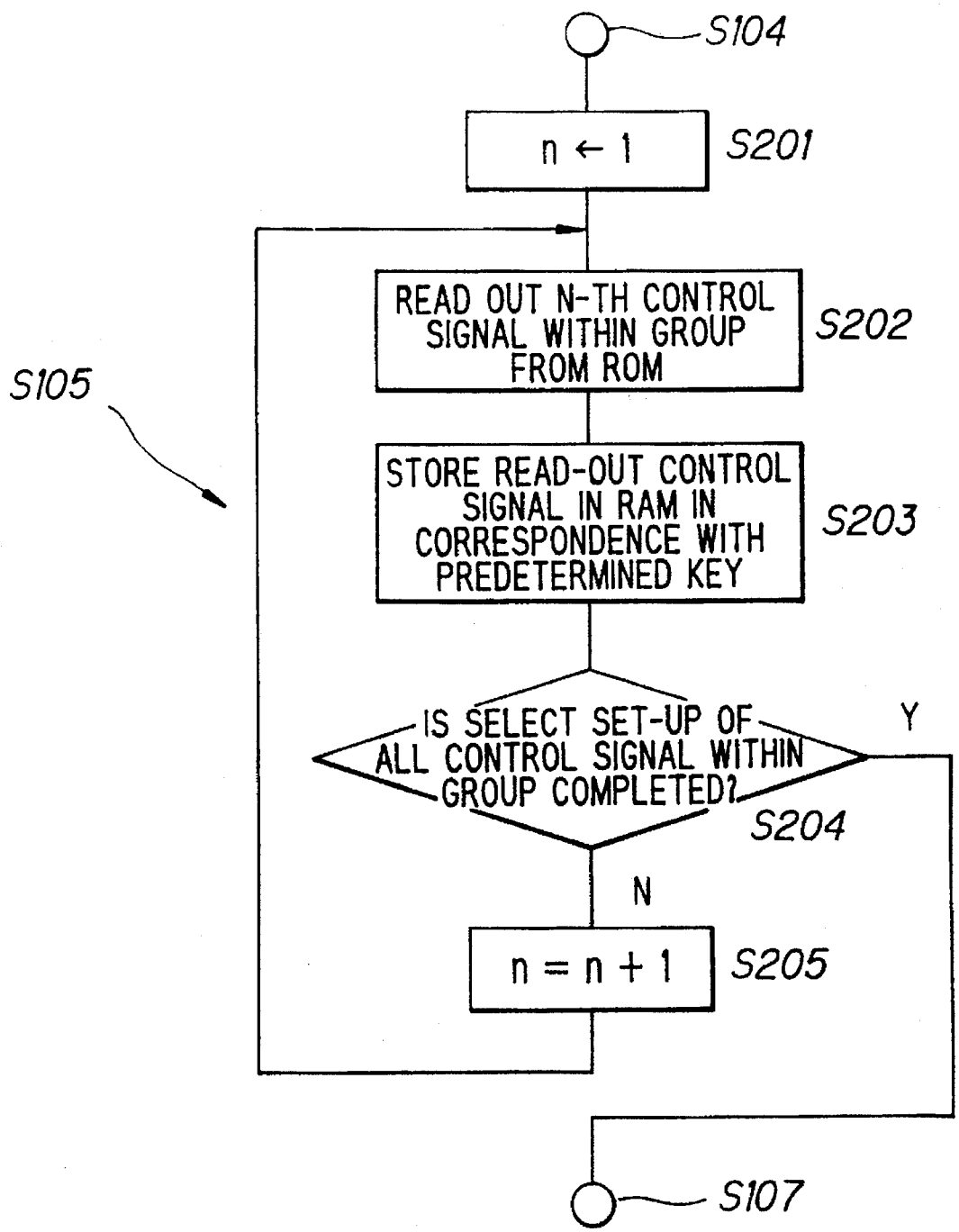
FIG. 8 is a flow chart of the process in the selective set-up mode of the control signal for the remote controller according to the first embodiment of the invention.

In the normal state, the remote controller is in the operational mode in which a control signal is outputted in correspondence with the operating key 2, however, in the remote controller in accordance with this embodiment, first the mode key 2M is switched over by the user so that the control unit 4 proceeds to the select set-up mode, as shown in FIG. 7, from the operational mode of the control unit 4.

When the remote controller is in the select set-up mode, the control section 40 is ready for the control signal to be input thereinto from the input part 7 in step S101. In this case, the user performs the operation for transmitting the control signal of, for example, the channel "1" to the remote controller by using the remote controller for the television set that has been used by the user so far. The control signal that should be inputted by the user has been determined in advance as, for example, the control signal of the channel "1".

When the user operates the other remote controller as a result of which the infrared ray control signal is inputted into the input part 7, the control signal is sampled in the input sampling section 8 and, thereafter, is introduced into the input control buffer 41 of the control section 4 through the input register 9. When the control signal is introduced into the input control buffer 41 in step S102, the control section 40 executes the signal analysis process in the analyzing section 45 in step S103.

The signal analyzing process will be described in more detail. First of all, the input control signal is compared to each format of the control signals stored in the ROM 5 to thereby identify the format. For instance, the carrier of the input control signal is compared to a carrier of 40 KHz, a carrier of 36.667 KHz, a carrier of 37.917 KHz, a carrier of 32.768 KHz, and so on in order and then the identified carrier is judged to thereby complete the analyses. In the same way, the other factors such as pulse widths or the like are analyzed. In this example, it is assumed that the control signal that has been input corresponds to the format C shown in FIG. 13.

When the format has been identified with respect to the input control signal, then the category data and the function data are analyzed in accordance with the thus identified data, that is, in accordance with format C. Here, it is assumed that the analyses are such that the category data showing the television set, which is the target appliance, is "0F" and the function data showing the operational content, that is, the function, such as the channel "1" is "01".

Then, the control section 40 controls the ROM control/ data buffer 43 to search in the preset data of the ROM 5 for the data of format C, the category data showing the television set as "0F", and the function data "01" showing the operational function as channel "1". The signal group of the format C and the code system 6 shown in FIG. 13 corresponds to this state. Thus, the kind of model has been identified in accordance with the inputted control signal, as in step S104, YES of FIG. 7.

In the case where no control signal group of the formats or code systems corresponding to the data preset in the ROM 5 is identified, it is impossible to identify the model in accordance with the input control signal, as where step S104 is NO, and the program proceeds to step S106. In such case, the RAM control/data buffer 44 stores the inputted control signal in addresses of the RAM 6 corresponding to a predetermined operating key.

When the kind of mode has been identified in accordance with the inputted control signal, a predetermined control signal is read out from the ROM 5 corresponding to the kind of model and is stored in a predetermined address of the RAM 6 in step S105. Namely, the select set-up operation causing the predetermined control signal in the ROM 5 to correspond to the operating key 2 in the RAM 6 is performed. Nevertheless, in step S105 not only is the inputted control signal, that is, the control signal having the same format/code system, the same category code and function code, caused to correspond to the specific operating key 2, but also all the control signals set in the same group to which the control signal belongs are caused to correspond to the operating key 2 for storage in the RAM 6. The flowchart of FIG. 8 represents this process in more detail.

Namely, if the thus inputted control signal is identified so that the control signal has the format C and the channel "1" in the code system 6 shown in FIG. 13, then the variable n is set as 1 in step S201 and the first control signal of the group, in which the control signal of the channel "1" in format C code system 6, is read out from the ROM 5 in step S202. Here, assume that the twelve control signals from the channel "1" to the channel "12" are set as a single group. When the control signal of the channel "1" set as the first control signal is read out, the control signal is stored in the RAM 6 in the address corresponding to the operating key "1" of the operating keys 2 shown in FIG. 1 in step S203 of FIG. 8.

Such a process is repeated by incrementing the variable n in step S205, and at the time when all the control signals of the group are stored into the RAM 6 in step S204, the program or process is terminated in step S105. In this case, at the stage that each control signal from channel "1" to channel "12" in the format C, code system 6 is caused to correspond to the associated one of the keys "1" to "12" of the operating keys 2 for storage in the RAM 6, the program is terminated.

After the select setup operation has been completed in step S105 or step S106 in FIG. 7, the control section 40 of FIG. 5 controls the sound generating output section 47 so as to output an electronic sound representative of the select set-up completion of the preset from the sound generator 10 at step S107.

Thus, the operation has been completed for the select set-up. Here, if the user operates the mode key 2M to return to the normal mode, then the control signal output operation corresponding to the operating keys may be carried out and the remote controller functions as desired.

Various other modes or systems than that shown in FIG. 1 where the a slide switch is used as a mode key 2M may be present for switching the mode to the select set-up mode. For example, the mode key can be a press type and during depression of the mode key the control signal from the other remote controller is introduced so as to execute the above-described select set-up operation. Then, upon the completion of the select set-up, the operational mode is automatically returned to the normal operational mode.

Figure 9:
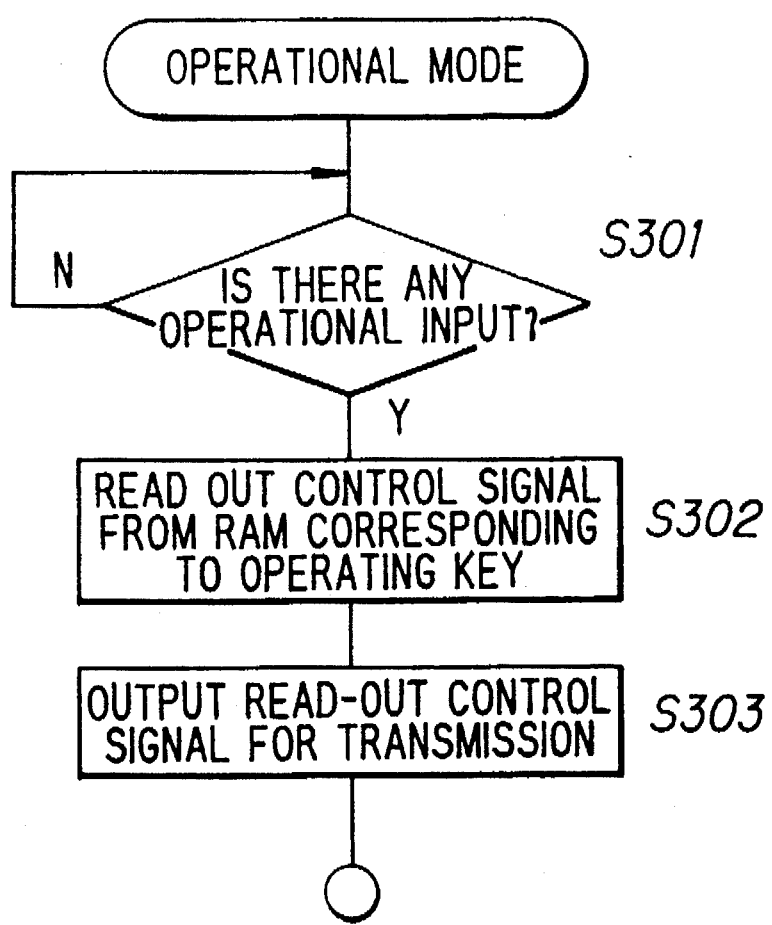
FIG. 9 is a flow chart of a process in a operational mode of the remote controller according to the first embodiment of the invention.

After such a select set-up has been carried out, the process shown in FIG. 9 may be executed in the operational mode to control the equipment. Namely, the control section 40 assigns the address in the RAM 6 in accordance with the operational information based on which operating key has been depressed as introduced into the key input buffer 42 together with the operation operating keys 2 in step S301 and causes the RAM control/data buffer 44 to read out the corresponding control signal in step S302.

The control signal that has been read out is sent to the output part 46 and is outputted as an infrared ray modulating signal from the light emitter 1 in step S303. In the above-described process, the remote operation for the electronic equipment is executed, for example, if the select set-up is effected by pressing the operating key "1", the control signal where the format C is selected, the category data representative of the television set is "0F" and the function data representative of the operational content of the channel "1" is "01" will be outputted.

In the foregoing first embodiment, if the control signal is output to the inventive remote controller by using the remote controller which had been used in the past then in an automatic manner the format, code system, control content, and the like are analyzed, and the desired control signal is read out from the ROM 5 and stored in the RAM 6, so that the preset select set-up is executed. Accordingly, the conventionally complicated operation wherein the keys are operated while looking up a whole table of the preset select set-up prepared by each manufacturer may be obviated. Then, when the user effects the select set-up of the preset data, even if he or she did not know the name of the maker and the model of the electronic equipment and the formats, code systems, and the like of the control signals used in the equipment, the user can select set-up without any problem.

Furthermore, the control signals for switching-over the channels "1" to "12" are set as a single group and the channel control signal for the channels "1" to "12" are automatically selectively set up in correspondence with the control signal input of the channel "1", so that the work imposed on the user may be further reduced.

As a further explanation, in this embodiment the channel select control signal for the channels "1" to "12" has been explained as a single group but, actually, it is also possible to set all the control signals relating to the television set of the same maker and model as a single group. In addition to the channel select control signals from the channels "1" to "12", it is possible to set as a single control group, for example, the control signals representative of the single category to which the power ON/OFF, sound volume, channel select UP/DOWN, and the like belong.

Furthermore, in the same manner the control signals for VTRs, disc players, and the like may be set on a group basis in terms of each maker and model. For example, it is recommendable to set, as a single group, all the control signals, such as playback, record, fast forward, rewind, stop, and the like. By grouping the category data unit as a single group, it is unnecessary to effect a special process for setting the group setting. Also, this is particularly convenient for the user who possesses VTRs, disc players and the like from different makers to selectively set up the modes in conformity with the operating keys for each piece of equipment.

It is also possible to make a single group including a plurality of categories, wherein the control signals of the same formats and the same code systems are all grouped into a single group and the single control signal is input as described above, whereby all the control signals in the same group may be selectively set up. It is also possible to variously set the groups depending upon the actual use situation.

Figure 10:
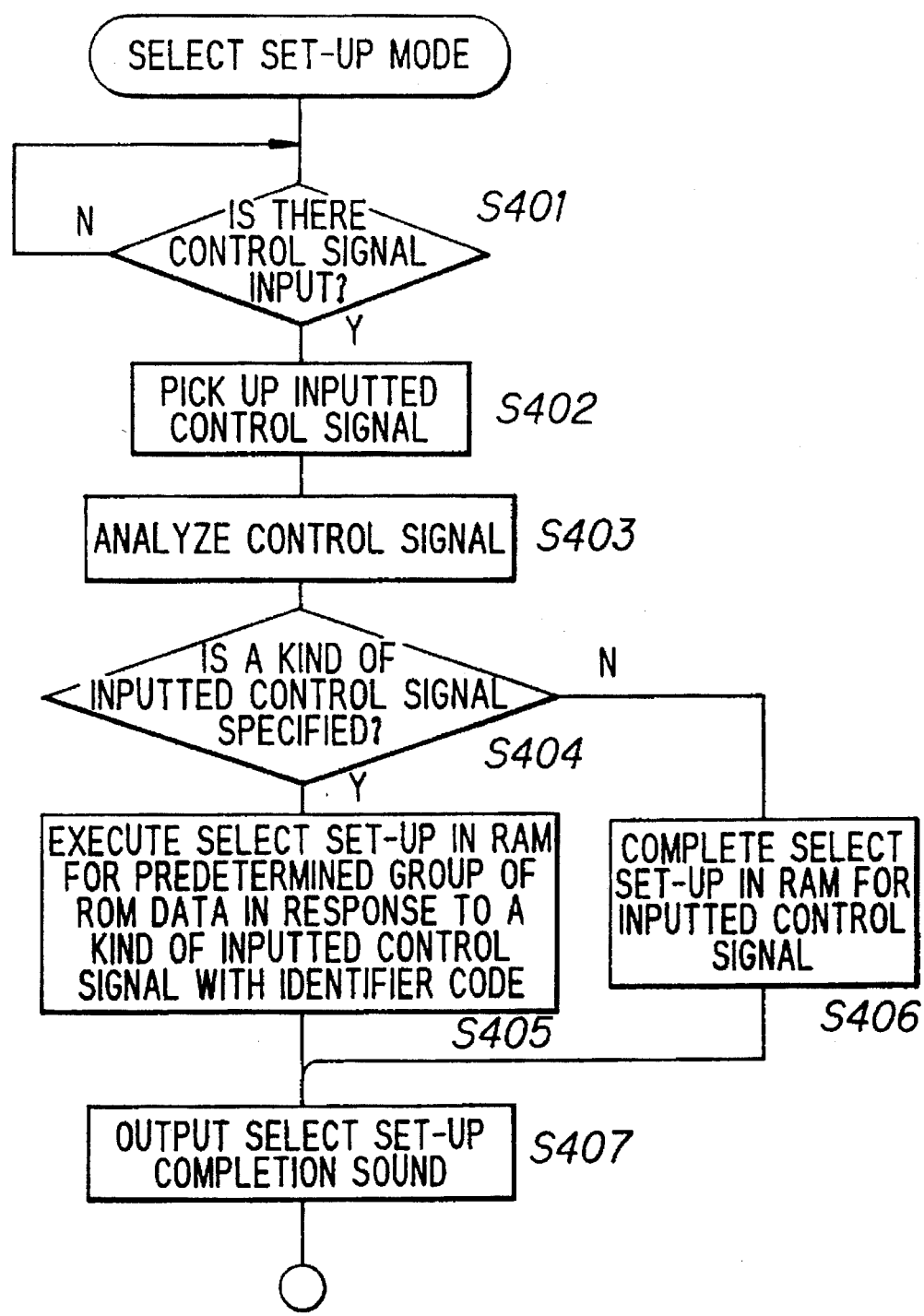
FIG. 10 is a flow chart of a process in a selective set-up mode of the control signal for the remote controller according to a second embodiment of the invention.
Figure 11:
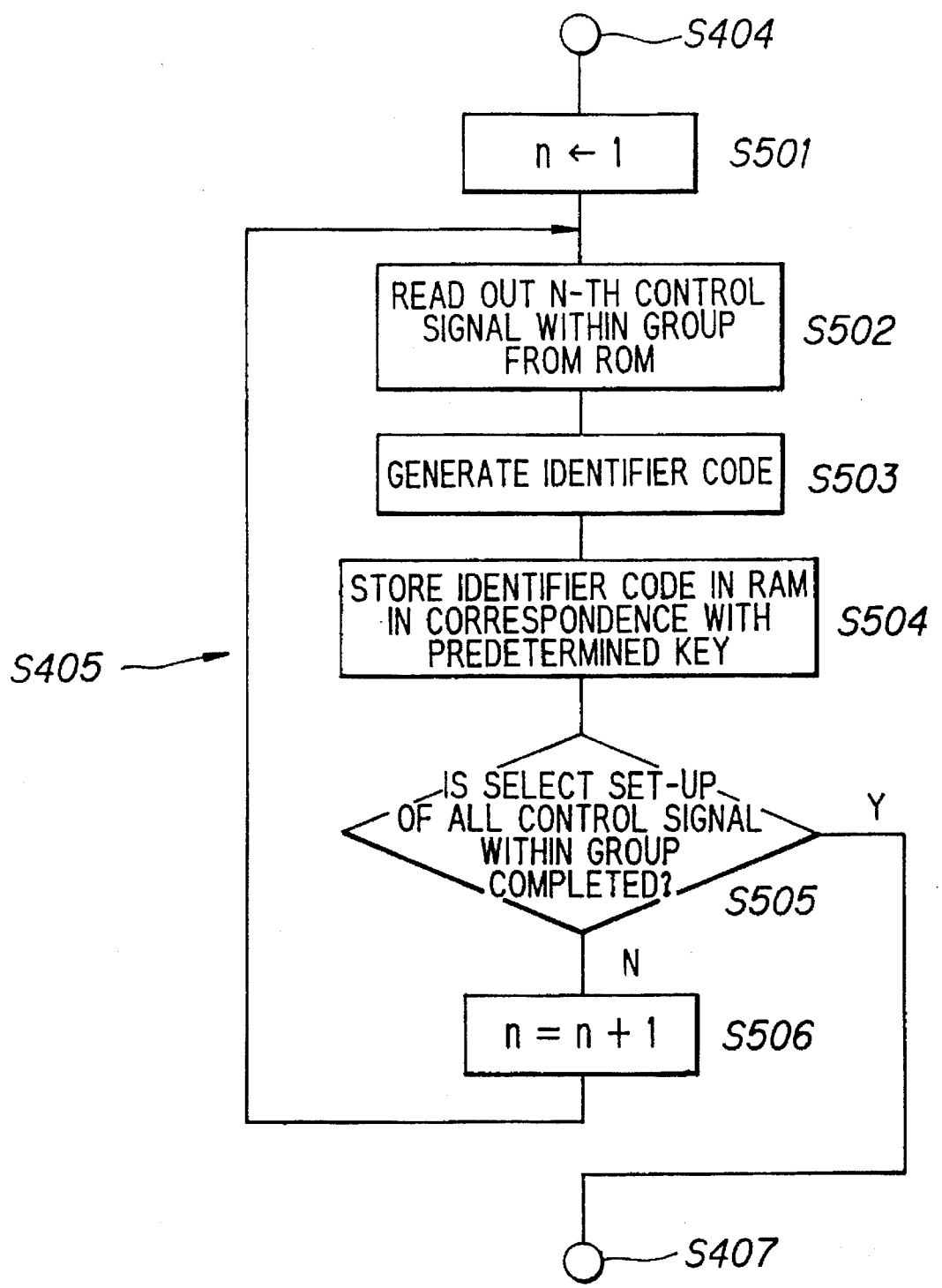
FIG. 11 is a flow chart of the process in the selective set-up mode of the control signal for the remote controller according to the second embodiment of the invention.

The select set-up operation and the output operation of the control signals based upon the select set-up operation in accordance with a second embodiment will be explained with reference to the flowcharts shown in FIGS. 10 to 12, wherein it is assumed that the control signals adopted for the respective formats/code systems as shown in FIG. 13 are preset in the ROM 5.

When the user operates the mode key 2M and the control unit 4 is in the select set-up mode, the control section 40 is ready for the control signal to be input thereinto from the input part 7 in step S401. In this case, the user performs the operation for transmitting the control signal of, for example, channel "1" to the inventive remote controller by using the remote controller for the television set which had been used in the past by the user. When the user operates this other remote controller as a result of which the infrared ray control signal is inputted into the input part 7, the control signal is sampled in the input sampling section 8 and, thereafter, is introduced into the input control buffer 41 of the control section 4 through the input register 9. When the control signal is introduced into the input control buffer 41 at step S402, the control section 40 executes the signal analysis process in the analyzing section 45 at step S403.

In the signal analyzing process, the input control signal is compared to each format of the control signals stored in the ROM 5 to thereby judge the format factors such as carriers and pulse widths. Here, it is assumed that the control signal that has been input corresponds to the format C shown in FIG. 13.

When the format has been identified with respect to the input control signal, then the category data and the function data are analyzed in accordance with the thus identified data, that is, format C. In this example, the analyses are such that the category data showing the television set that is the target appliance is "0F" and the function data showing the operational content or function such as channel "1" is "01".

Then, the control section 40 controls the ROM control/data buffer 43 to search in the preset data of the ROM 5 the data where the format is format C, the category data showing the television set are "0F" and the function data showing the operational function as the channel "1" is "01".

Namely, the signal group of the format C and the code system 6 shown in FIG. 13 corresponds to this state, in which case the kind of model has been identified in accordance with the inputted control signal in step S404, YES.

In the case where there is no control signal group of the formats/code systems corresponding to the data preset in the ROM 5, it is impossible to identify the kind of model in accordance with the inputted control signal in step S404, NO, then the program proceeds to step S106. In this case, the RAM control/buffer 44 stores the inputted control signal in addresses of the RAM 6 corresponding to a predetermined operating key.

In the case where the kind of model has been identified in accordance with the input control signal, a predetermined control signal is read out from the ROM 5 corresponding to the kind of model and is stored in a predetermined address of the RAM 6. More specifically, the select set-up operation causing the predetermined control signal in the ROM 5 to correspond to the operating key 2 in the RAM 6 is performed. In the second embodiment, the control signal is not stored in the RAM 6 in the same form but is stored in accordance with the analysis data in the analyzing section 45.

In this embodiment, in step S405 not only is the same kind of input control signal, that is, the control signal having the same format/code system, the same category code, and function code, caused to correspond to the specific operating key 2, but all the control signals set in the same group to which the control signal belongs are also caused to correspond to the operating key 2 for storage in the RAM 6. The flowchart of FIG. 11 shows this process in more detail.

For example, if the input control signal is identified so that the control signal has the format C and the channel "1" in the code system 6 shown in FIG. 13, then, the variable n is set to 1 in step S501 and the first control signal of the group in which the control signal of the channel "1" in the format C, code system 6 is read out from the ROM 5 in step S502. Here, it is assumed that the twelve control signals from channel "1" to channel "12" are set as a single group.

When the first control signal and the set control signal of the channel "1" are read out in step S502, the control signal is analyzed in the same way as for the input control signal to generate an identifier code in step S503. The identifier code is produced by synthesizing, for example, a name code, a carrier frequency code, a category code and a function code of the format/code system. When the identifier code has been produced, the identifier code of the control signal of the channel "1" is stored in the RAM 6 in the address corresponding to the operating key "1" of the operating keys 2 shown in FIG. 1 in step S504.

Such a process is repeated by incrementing the variable n in step S506 and, at the time when all the control signals of the group are stored into the RAM 6, the process in step S405 is terminated in step S505. In this case, at the stage that each control signal of the channel "1" to the channel "12" in the format C, code system 6 is caused to correspond to the associated one of the keys "1" to "12" of the operating keys 2 for the storage in the RAM 6, and the program is terminated.

Thus, after the select setup operation has been completed in step S405 or in step S406, the control section 40 controls the sound generating output section 47 so as to output an electronic sound representative of the select set-up completion of the preset from the sound generator 10 in step S407. Thus, the operation has been completed for the select set-up.

Figure 12:
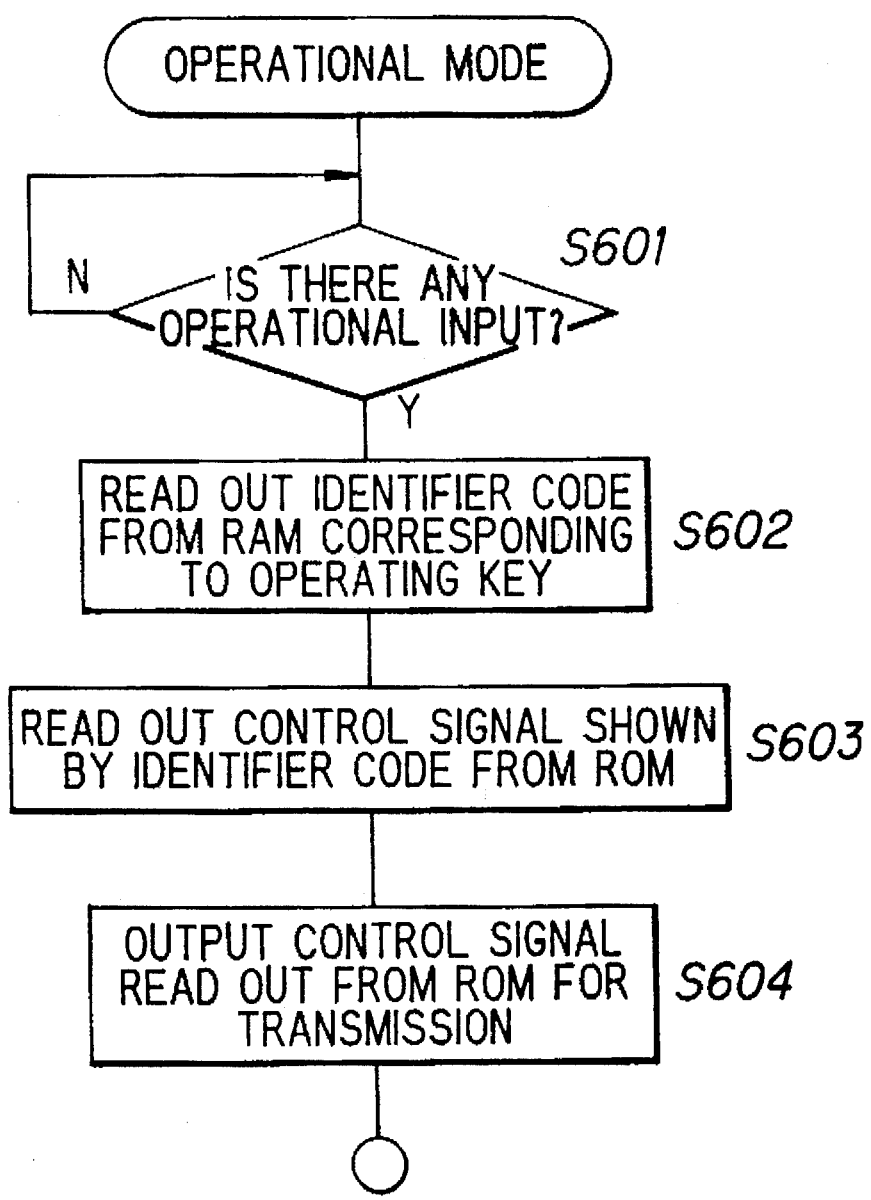
FIG. 12 is a flow-chart of a process in a operational mode of the remote controller according to the second embodiment of the invention.

After such a select set-up has been carried out, the process shown in FIG. 12 may be executed in the operational mode, in which the control section 40 assigns the address in the RAM 6 in accordance with the operational information, that is, in accordance with which operating key has been depressed, introduced into the key input part 42 together with the operation of the user's operation of the operating keys 2 in step S601, and causes the RAM control/data buffer 44 to read out the corresponding identifier code in step S602.

The control signal is read out from the ROM 5 from the read-out identifier code in step S603, is sent to the control output part 46 and is outputted as an infrared ray modulating signal from the light emitter 1 in step S604. With the above-described process, the remote operation for the electronic equipment is executed, for example, if the select set-up is effected as described above, by pressing the operating key "1", the control signal where the format C is selected, the category data representative of the television set is "0F" the function data representative of the operational content of the channel "1" is "01" will be outputted.

In this second embodiment, in addition to the advantages of the first embodiment, in particular, it is possible to save the capacity of the RAM 6 by storing the data in the identifier codes. In the case of the conventional system, the input control signals to be learned or stored in the form of wave sampling data and, hence, a large capacity is needed for the RAM. The second embodiment may effectively overcome this problem.

Furthermore, in the case of storage of the sampling data, there is a fear that a readout error would occur due to an inevitable error in sampling frequency. This can be obviated by the second embodiment.

Although the first and second embodiments have been fully explained, it is possible to selectively switch the operational modes by having a certain one of the operating keys 2 correspond to a plurality of control signals. For example, the numbered keys "1" to "12" are caused to correspond to the select channel control signals from channels "1" to "12" in the case of the operational mode for a television set and, also, are caused to correspond to the control signals for the track access to the tracks 1–12 in the case of the operational mode for a disc player.

Thus, by causing the control signals to correspond to the plurality of equipment through the mode switching, it is possible to realize a remote controller that is more convenient. It is also apparent that the processing flowcharts for the select set-up operation according to the invention are not limited to FIGS. 7 or 10 but many modifications may be possible.

The present invention also provides a third embodiment in which it is possible to carry out the "learn" and select set-up process corresponding also to the toggle code.

Figure 14:
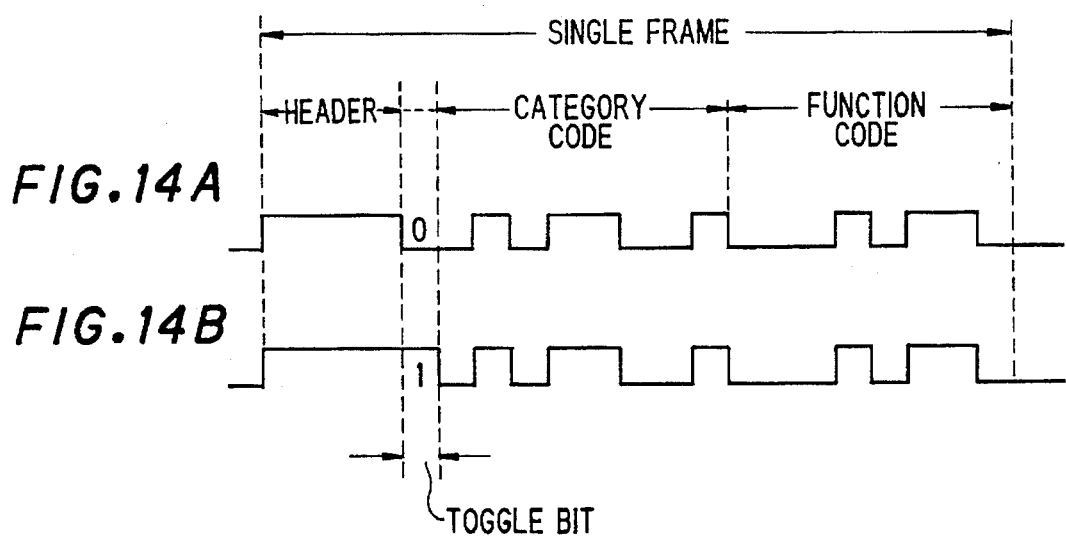
FIGS. 14(a) and 14(b) are waveforms of control signals employing the toggle code.

The "toggle" code means that a toggle bit is provided at a predetermined location as shown in FIGS. 14(a) and 14(b) in addition to the header, category, and function codes that are provided in a single frame, as shown in FIG. 6 and described above. The toggle bit is output while being reversed in response to every operation. Namely, during the first operation for a certain key, a control signal shown in FIG. 14(a) is outputted, during the second operation, a control signal shown in FIG. 14(b) is outputted, and during the third operation, the control signal shown in FIG. 14(a) is outputted, and so on. The binary toggle bit is thus reversed in value for every successive operation.

Figure 15:
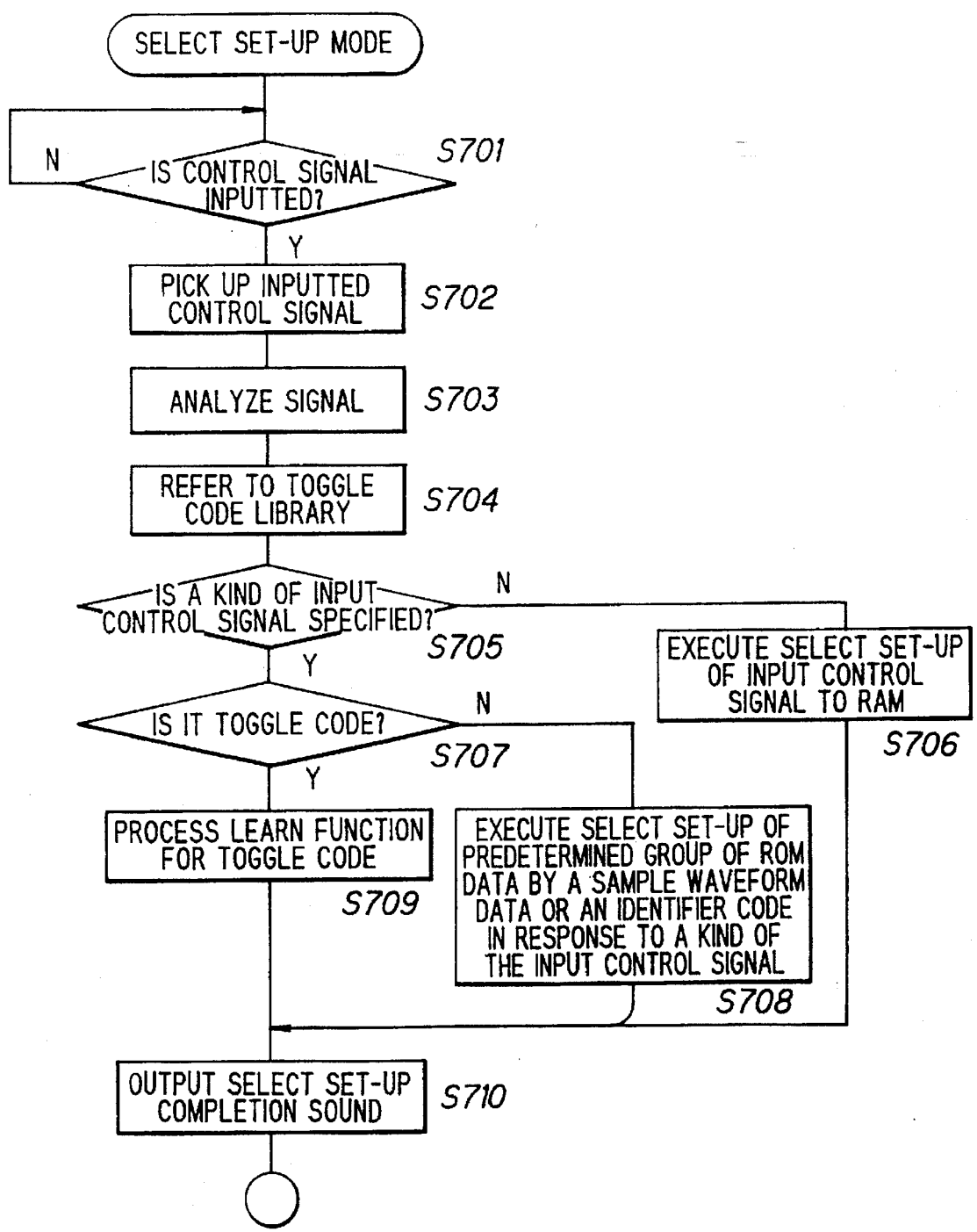
FIG. 15 is a flow chart of a process in a selective set-up mode of the control signal for the remote controller according to a third embodiment of the invention.

According to this embodiment, in order to cope with such a toggle code, the controller 4 executes the process shown in FIG. 15 in the select set-up mode. The process shown in steps S701, S702 and S703 is the same as in FIG. 7 and FIG. 10 hence explanation thereof will be omitted.

A "toggle code library" stored in the ROM 5 is referred to in step S704 after the control signal has been analyzed to recognize the format/code system of the control signal. The toggle code library stores information such that each control signal group, or a part of the control signal of the control signal group, includes a toggle code in its format/code system for the toggle code being adopted. Namely, if a certain format/code system is adopted, it is possible to determine whether the control signal of the format/code system is in the form of a toggle code by searching the toggle code library.

In the case where as a result of the signal analyses in the analyzing section 45, the control signal group corresponding to the format/code system is not present within the preset data of the ROM 5, the controller 4 determines that it is impossible to specify the kind of system with respect to the input control signal in step S705, NO and thereby proceeds to step S706. In this case, the inputted control signal is stored in the address of the RAM 6 corresponding to the predetermined operating key by the RAM control/buffer 44.

In the case where the kind of system is specified with respect to the input control signal, the program proceeds to step S707 to refer to the toggle code library to determine whether the signal is in the form of the toggle code. If the signal is not in the form of the toggle code, the program proceeds to step S708. In the same manner as in the first embodiment and the second embodiment, a predetermined control signal is read out from the ROM 5 in correspondence with the kind of the identified format/code system and is stored in a predetermined address of the RAM 6. Namely, the select set-up operation in which the predetermined control signal within the ROM 5 is caused to correspond to the operating key 2 in the RAM 6 is carried out. In other words, it is possible to carry out the select set-up through the process shown in FIG. 8 or FIG. 11.

If the control signal is in the form of a toggle code, the program proceeds to step S709 to carry out the select set-up for the toggle code. It is possible to specify the toggle bit from the analyzed format and, therefore, two kinds of codes "0" and "1" are stored as a single control signal through the toggle code select set-up process.

In the actual process, as explained above in conjunction with the first and second embodiments, if the user inputs a control signal of the channel "1", as shown in, for example, FIG. 16, each control signal in which the format/code system have been set up in the form of a group is stored in the RAM 6 so that the control signals correspond to operating keys such as channels 1, 2, and so on. In this case, as shown in FIG. 13, two kinds of codes are stored with respect to the single control signal.

If any of steps S706, S708 and S709 has been completed, the select set-up completion sound is produced at step S710 to terminate the process.

With respect to the operating mode in correspondence with the select set-up process, the same control signals may be used as in the first and second embodiments except for the toggle codes. In the case where the toggle code is selectively set up so that two kinds of control signals are stored for the single operating key, as shown in FIG. 13, the control codes are alternatively read out and output for every operation.

Thus, according to this embodiment, it is possible to apply the learn function to effect select set-up to the toggle code system.

It might be thought that the storage of the two kinds of codes for the toggle code would increase the required capacity of the RAM 5. Nevertheless, only a single code is stored and a bit representative of the toggle code is added so that the toggle bit is outputted while being reversed for every operation in the process of the control section 40 during the output operation, thereby saving the capacity of the RAM.

A fourth embodiment that is responsible to the toggle code will be explained with reference to FIG. 17. In the foregoing third embodiment, the toggle code library is referred to for determining whether the control signal inputted during the select set-up mode is a toggle code or not, so that there is the possibility that some toggle code formats or the like that are not stored in the toggle code library might be present. According to the fourth embodiment, in view of such a possibility, it is possible to respond to all the formats/code systems of the control signals.

Figure 17:
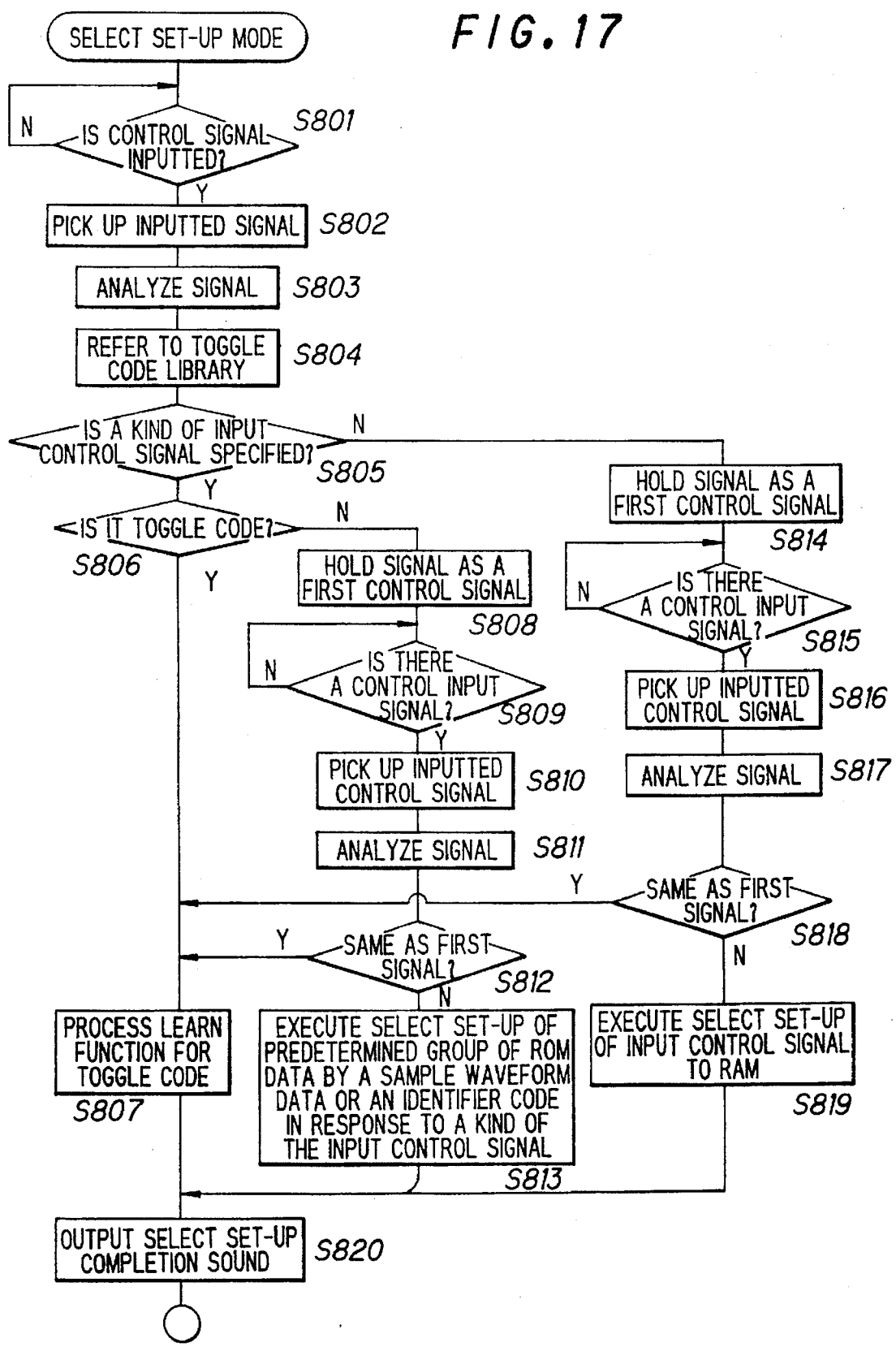
FIG. 17 is a flow-chart of a process in a selective set-up mode of the control signal for the remote controller according to a fourth embodiment of the invention.

In FIG. 17, steps S801 to S805 are the same as steps S701 to S705 shown in FIG. 15. The process for the case where the toggle code library is referred to and the input control signal is determined as the toggle code is carried out in the same way, and the program proceeds from step S806 to step S807 to perform the learn process for the above-described toggle code.

Even in the case where the format/code system of the control signal are determined to be excluded from the preset data by the analysis of the input control signal in step S805, NO, or in the case where the format/code system of the control signal are determined to be included in the preset data but to be excluded from the data within the toggle code library in step S806, NO, there is still the possibility that the control signal might be a toggle code.

Therefore, in these cases, the control section 40 retains the control signal, the control signal data or its analyzed data, in a register and waits for the next control signal input operation by the user in steps S808 and S814. For this reason, the user has to basically operate a predetermined key twice in the select set-up mode, for example, the channel "1" is to be operated twice.

If the second control signal is inputted, the signal analysis including the second control signal is carried out in steps S809 to S810 to S811 and in steps S815 to S816 to S817. Then, the program determines whether the second control signal is identical with the first control signal previously inputted in steps S812 and S818. The identified case means that the control signal is not the toggle code. On the other hand, in the case where the control signal is in the form of the toggle code the toggle bit is reversed between the first and second operations. In this case, the state is detected so that the control signals are not identified with each other.

In the case where it is determined that the control signal is not the toggle code, the program proceeds from step S812 to step S813 or from step S818 to step S819, the select set-up process in step S813 or the learn process in step S819 only for the control signal are carried out for a group unit in the same manner as in the foregoing embodiments.

In the case where it is determined that the control signal is the toggle code, the program proceeds to step S807 to perform the learn process for the toggle code as shown in FIG. 16. After any of the steps S807, S813 and S819 has been completed, the select set-up completion sound is outputted in step S820 to terminate the process.

In this fourth embodiment, it is possible to respond to an unknown toggle code which is not registered in the toggle code library. If the system is of the two input control signal, kind it is not always necessary to provide the toggle code library.

In the third and fourth embodiments, the learning operation for the toggle code is added to the first and second embodiments. It is, however, apparent for those skilled in the art to apply the present invention to a general learning operation.

Although the present invention has been described hereinabove with reference to the preferred embodiments, it is to be understood that the invention is not limited to such illustrative embodiments alone, and various modifications may be contrived without departing from the spirit or essential characteristics thereof, which are to be determined solely from the appended claims.

What is claimed is:

1. A remote controller having a plurality of operating buttons for operational input to transmit predetermined control signals to electronic equipment in response to actuation of one of the buttons for controlling the electronic equipment to perform respective operations, comprising:

input means for receiving a control signal produced by another remote controller;

decoder means for decoding the control signal received by said input means;

first storage means for storing preset data consisting of control signals corresponding to a plurality of signal structures associated with respective units of the electronic equipment and identification codes to discriminate at least one of carrier frequency, category, signal format, and function of said control signals;

second storage means for storing one of the predetermined control signals associated with each of the plurality of operating buttons;

comparing means for performing a comparison of said preset data with a decoded control signal from said decoder means and for outputting, in response to said comparison, one of a first comparison result and a second comparison result; and control means receiving one of the first comparison result and second comparison result from the comparing means;

wherein, upon the reception of the first comparison result, the control means reads out a predetermined control signal from said first storage means and stores the read-out signal in said second storage means at a predetermined address corresponding to one of the operating buttons in response to actuation of said one of the operating buttons to thereby selectively set up the preset data in response to the received control signal;

wherein, upon the reception of the second comparison result, the control means stores the control signal received by said input means in said second storage means at a predetermined address corresponding to one of the operating buttons; and whereby upon actuation of said one of the operating buttons when an operational mode is selected, the control signal stored in correspondence with the operated button is read out from said second storage means and transmitted.

2. The remote controller according to claim 1, wherein said preset data includes at least category information and function information.

3. The remote controller according to claim 1, wherein said comparing means compares a carrier frequency of a decoded control signal from said decoder means and predetermined frequencies stored in said first storage means to decide a format of the received control signal.

4. The remote controller according to claim 1, wherein said comparing means compares a decoded control signal from said decoder means with one of category data and function data.

5. The remote controller according to claim 1, wherein said control signal transmitted from said remote controller consists of identification code to discriminate at least one of signal format, carrier frequency, category, and function.

6. A remote controller having a plurality of keys whose operation transmits predetermined control signals to electronic equipment to thereby execute respective operations, comprising:

input means for detecting control signals transmitted from another remote controller;

decoder means for decoding control signals detected by said input means;

first storage means for storing preset data including control signals of a plurality of signal structures associated with respective units of the electronic equipment;

second storage means for storing one of the predetermined control signals and identifier codes representing the predetermined control signals associated with each of the plurality of keys; and control means for comparing said preset data with a decoded signal from the decoder means and for generating one of a first comparison result and a second comparison result;

wherein, upon generating a first comparison result the control means reads out respective control signals from said first storage means corresponding to detected control signals and stores one of the read-out control signals and the identifier codes representing the control signals at a plurality of predetermined addresses in said second storage means, each of said plurality of addresses corresponding respectively with a predetermined one of said plurality of keys to selectively set up the preset data in response to the detected control signal;

wherein, upon generating a second comparison result the control means stores the control signal received by said input means in said second storage means at a predetermined address corresponding to one of the operating buttons; and wherein upon a key being operated and an operational mode being selected, if a control signal had been stored at the predetermined address corresponding to the key being operated then the control signal stored at that predetermined address is read from the second storage means for transmission and if a control signal had not been stored at the predetermined address corresponding to the key being operated then the identifier codes stored in correspondence with the operated key are read out from said second storage means and the control signal corresponding to the read-out identifier codes are read out from said first storage means for transmission.

7. A method of presetting remote control signals to a remote controller having operating elements, comprising the steps of:

decoding a control signal input from another remote controller;

comparing a decoded signal and each preset data that was stored in a first storage memory;

determining agreement between the decoded signal and some preset data;

generating a positive agreement result if there is agreement between the decoded signal and the preset data to which it is compared and generating a negative agreement result if there is not agreement between the decoded signal and the preset data to which it is compared;

reading out, when said positive agreement result is generated, a predetermined control signal from said first storage memory;

storing, when said positive agreement result is generated, the read-out control signal in a second storage memory at a predetermined address in correspondence with one of said operating elements to thereby selectively set up the preset data in response to the input control signal; and storing, when said negative agreement result is generated, the decoded input control signal in the second storage memory at a predetermined address in correspondence with one of said operating elements.

8. The method according to claim 7, further comprising the step of:

determining if any of the operating elements is operated when an operational mode is selected and reading out and transmitting the control signal stored in correspondence with the operated operating elements from said second storage means on the basis of the determination.

9. The method according to claim 7, comprising the further steps of:

analyzing the carrier frequency of the decoded signal;

comparing the decoded signal and category data; and comparing the decoded signal and function data.

10. The method according to claim 7, wherein said preset data provide at least category information and function information.

11. The method according to claim 7, wherein said step of comparing includes comparing the decoded signal and one of category data and function data.

12. The method according to claim 7, wherein said preset data to be stored in the second storage memory is an identification code that discriminates at least one of carrier frequency, category, and function.

13. The method according to claim 8, wherein said control signal transmitted from the remote controller consists of identification code that discriminates at least one of signal format, carrier frequency, category, and function.

* * * * *